(12) United States Patent
Sonoda et al.

(10) Patent No.: US 10,014,489 B2
(45) Date of Patent: Jul. 3, 2018

(54) ELECTROLUMINESCENT DEVICE AND MANUFACTURING METHOD

(71) Applicant: Sharp Kabushiki Kaisha, Sakai, Osaka (JP)

(72) Inventors: Tohru Sonoda, Sakai (JP); Takeshi Hirase, Sakai (JP); Tetsuya Okamoto, Sakai (JP); Tohru Senoo, Sakai (JP); Seiji Fujiwara, Sakai (JP); Daichi Nishikawa, Sakai (JP); Mamoru Ishida, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/517,524

(22) PCT Filed: Oct. 8, 2015

(86) PCT No.: PCT/JP2015/078570
§ 371 (c)(1),
(2) Date: Apr. 7, 2017

(87) PCT Pub. No.: WO2016/060053
PCT Pub. Date: Apr. 21, 2016

(65) Prior Publication Data
US 2017/0324061 A1    Nov. 9, 2017

(30) Foreign Application Priority Data

Oct. 15, 2014 (JP) .................................. 2014-211109

(51) Int. Cl.
*H01L 35/24* (2006.01)
*H01L 51/52* (2006.01)
(Continued)

(52) U.S. Cl.
CPC ...... *H01L 51/5246* (2013.01); *H01L 27/3244* (2013.01); *H01L 51/0097* (2013.01); *H01L 51/56* (2013.01)

(58) Field of Classification Search
CPC .......................... H01L 51/5246; H01L 51/56
(Continued)

(56) References Cited

U.S. PATENT DOCUMENTS

2003/0003225 A1    1/2003  Choi et al.
2003/0164677 A1    9/2003  Miyaguchi et al.
(Continued)

FOREIGN PATENT DOCUMENTS

JP    2000-223264 A    8/2000
JP    3921482 B2       5/2007
(Continued)

OTHER PUBLICATIONS

Official Communication issued in International Patent Application No. PCT/JP2015/078570, dated Dec. 15, 2015.

*Primary Examiner* — Anthony Ho
(74) *Attorney, Agent, or Firm* — Keating & Bennett, LLP

(57) ABSTRACT

An organic EL display device 1 that includes a TFT substrate (substrate) 2 and an organic EL element (electroluminescent element) 4 provided on the TFT substrate 2 includes a sealing film 14 that seals the organic EL element 4. The sealing film 14 has a layered structure composed of an organic layer 14*b* and inorganic layers 14*a*, 14*c*. At least a peripheral portion 14*b*2 of the organic layer 14*b* has a lower carbon content than a central portion 14*b*1 of the organic layer 14*b*.

11 Claims, 16 Drawing Sheets

(51) Int. Cl.
*H01L 27/32* (2006.01)
*H01L 51/00* (2006.01)
*H01L 51/56* (2006.01)

(58) Field of Classification Search
USPC .......................................................... 257/40
See application file for complete search history.

(56) References Cited

U.S. PATENT DOCUMENTS

2014/0042408 A1   2/2014  Akagawa et al.
2015/0364720 A1  12/2015  Itoh

FOREIGN PATENT DOCUMENTS

| | | |
|---|---|---|
| JP | 3936375 B2 | 6/2007 |
| JP | 4006456 B2 | 11/2007 |
| JP | 2009-199957 A | 9/2009 |
| JP | 4401051 B2 | 1/2010 |
| JP | 2013-016372 A | 1/2013 |
| JP | 2014-035799 A | 2/2014 |
| JP | 2014-151571 A | 8/2014 |
| WO | 2014/119750 A1 | 8/2014 |

ELECTROLUMINESCENT DEVICE AND MANUFACTURING METHOD

TECHNICAL FIELD

The present invention relates to an electroluminescent device including an EL (electroluminescent) element, and a method for producing the same.

BACKGROUND ART

In recent years, flat panel displays are used in various commodity products and fields, and thus flat panel displays are required to have a large size, high image quality and low power consumption.

Under the circumstances, organic EL display devices, which include an organic EL (electroluminescent) element that utilizes electro luminescence of an organic material, are attracting great attention as all-solid state flat panel displays that are excellent as having capability of low voltage operation, quick responsivity and light emission.

In an active matrix type organic EL display device, e.g., a thin-film organic EL element is provided on a substrate having TFTs (thin-film transistors). The organic EL element includes an organic EL layer (including a light emitting layer) that is disposed between a pair of electrodes. The TFTs are connected to one of the pair of electrodes. A voltage is applied across the pair of electrodes so that the light emitting layer emits light, thereby displaying images.

In the above conventional organic EL display device, it is known that a sealing film is formed on the organic EL element in order to prevent the degradation of the organic EL element due to moisture or oxygen.

In the above conventional organic EL display device, as described in Patent Document 1 below for example, a sealing film composed of a resin sealing film (an organic layer) and an inorganic passivation sealing film (an inorganic layer) that are stacked alternately is formed on the organic EL element. It has been considered that in the conventional organic EL display device, the sealing film can prevent the degradation of the organic EL element due to moisture or oxygen.

PRIOR ART DOCUMENT

Patent Document

Patent Document 1: JP 2000-223264 A

DISCLOSURE OF INVENTION

Problem to be Solved by the Invention

However, in the above conventional organic EL display device, the end face of the organic layer is exposed to the outside. Because of this, moisture sometimes enters from the end face of the organic layer and degrades the organic EL element, which decreases reliability.

One way to solve this problem is to cover the end face of the organic layer with, e.g., an inorganic layer to avoid the exposure of the end face of the organic layer to the outside. However, in this case, different masks need to be used to form the organic layer and inorganic layer. As a result, the replacement of the masks is required, and the organic layer and the inorganic layer cannot be formed sequentially. This sometimes causes new problems such as the formation of a gap in an interface between the organic layer and the inorganic layer, impairment of the production cycle time, and difficulty in narrowing the frame of the organic EL display device.

With the foregoing in mind, it is an object of the present invention to provide a highly reliable electroluminescent device that improves the sealing property of a sealing film even when an end face of an organic layer of the sealing film is exposed to the outside, and a method for producing the same.

Means for Solving Problem

To achieve the above object, an electroluminescent device according to the present invention that includes a substrate and an electroluminescent element provided on the substrate includes a sealing film that seals the electroluminescent element. The sealing film has a layered structure composed of an organic layer and an inorganic layer. In the sealing film, at least a peripheral portion of the organic layer has a lower carbon content than a central portion of the organic layer.

In the thus configured electroluminescent device, the sealing film seals the electroluminescent element and has a layered structure composed of an organic layer and an inorganic layer. In the sealing film, at least a peripheral portion of the organic layer has a lower carbon content than a central portion of the organic layer. Thus, unlike the above conventional example, even when the end face of the organic layer of the sealing film is exposed to the outside, it is possible to reduce the entrance of moisture into the organic layer. As a result, the sealing property of the sealing film is improved, and a highly reliable electroluminescent device is configured.

In the electroluminescent device, it is preferable that in the sealing film, an end face of the organic layer is exposed to the outside.

In this case, the organic layer and the inorganic included in the sealing film can be formed using a mask of the same size, which simplifies the production steps of the electroluminescent device and easily improves the productivity of the electroluminescent device.

In the electroluminescent device, it is preferable that in the peripheral portion of the organic layer, a low-carbon-content region that has a lower carbon content than the central portion of the organic layer is formed in a frame shape in a predetermined width from an end face of the organic layer.

In this case, even when the end face of the organic layer of the sealing film is exposed to the outside, it is possible to reduce the entrance of moisture into the organic layer reliably.

Further, the electroluminescent device may be configured so that: in the peripheral portion of the organic layer, a first low-carbon-content region that has a lower carbon content than the central portion of the organic layer is formed in a frame shape in a predetermined width from an end face of the organic layer; and between the central portion and the first low-carbon-content region of the organic layer, a second low-carbon-content region that has a lower carbon content than the central portion of the organic layer is formed in a frame shape in a predetermined width.

In this case, even when the first low-carbon-content region is not formed appropriately, the second low-carbon-content region can reduce the entrance of moisture into the organic layer.

The electroluminescent device may be configured so that, in the organic layer, the width of the second low-carbon-content region is smaller than that of the first low-carbon-content region.

In this case, it is possible to simplify the production steps of the electroluminescent device.

In the electroluminescent device, it is preferable that the carbon content of the at least the peripheral portion of the organic layer is 85% or less of that of the central portion of the organic layer based on a C—H bond ratio of Fourier Transform Infrared Spectroscopy (FT-IR).

In this case, even when the end face of the organic layer of the sealing film is exposed to the outside, it is possible to reduce the entrance of moisture into the organic layer reliably and improve the sealing property of the sealing film reliably.

In the electroluminescent device, at least a peripheral portion of the sealing film may be irradiated with laser light to reduce the carbon content of the at least the peripheral portion of the organic layer.

In this case, it is possible to reduce the carbon content of the at least the peripheral portion of the organic layer reliably.

In the electroluminescent device, the laser light may be infrared laser light.

In this case, it is possible to reduce the carbon content of the at least the peripheral portion of the organic layer efficiently.

In the electroluminescent device, a photothermal conversion layer may be provided at least part of the at least the peripheral portion of the sealing film.

In this case, the photothermal conversion layer converts laser light into heat, thereby easily reducing the carbon content of the at least the peripheral portion of the organic layer, regardless of the type of laser light.

The electroluminescent device may include: a counter substrate that is located opposite the substrate; and a sealing material in a frame shape that is provided between the substrate and the counter substrate and that seals the electroluminescent element together with the substrate and the counter substrate.

In this case, it is possible to prevent the degradation of the electroluminescent element more reliably.

A method for producing an electroluminescent device of the present invention that includes a substrate and an electroluminescent element provided on the substrate includes: a sealing film formation step of forming an organic layer and an inorganic layer using a CVD method or a sputtering method and forming a sealing film that has a layered structure composed of the organic layer and the inorganic layer and that seals the electroluminescent element; and a laser light irradiation step of irradiating at least a peripheral portion of the sealing film with laser light to lower a carbon content of at least a peripheral portion of the organic layer than a carbon content of a central portion of the organic layer.

In the production method of the thus configured electroluminescent device, the sealing film formation step is performed to form a sealing film that has a layered structure composed of an organic layer and an inorganic layer. The laser light irradiation step is performed to lower a carbon content of at least a peripheral portion of the organic layer than a carbon content of a central portion of the organic layer. With this configuration, unlike the above conventional example, even when the end face of the organic layer of the sealing film is exposed to the outside, it is possible to reduce the entrance of moisture into the organic layer. As a result, the sealing property of the sealing film is improved, and a highly reliable electroluminescent device is configured.

The production method of the electroluminescent device may further include, prior to the laser light irradiation step, a photothermal conversion layer formation step of forming a photothermal conversion layer at least part of the at least the peripheral portion of the sealing film.

In this case, the photothermal conversion layer converts laser light into heat, thereby easily reducing the carbon content of the peripheral portion of the organic layer, regardless of the type of laser light.

In the production method of the electroluminescent device, it is preferable that a mask of the same size is used in the sealing film formation step to form the organic layer and the inorganic layer included in the sealing film.

In this case, the organic layer and the inorganic layer can be formed sequentially, which prevents the formation of a gap in an interface between the organic layer and the inorganic layer. Further, this prevents the impairment of the production cycle time. Moreover, the frame of the electroluminescent device can be narrowed easily.

Effects of the Invention

According to the present invention, it is possible to provide a highly reliable electroluminescent device that improves the sealing property of a sealing film even when an end face of an organic layer of the sealing film is exposed to the outside, and a method for producing the same.

BRIEF DESCRIPTION OF DRAWINGS

FIG. 7 is a view illustrating the specific production steps of the sealing film formation step.

DESCRIPTION OF THE INVENTION

Figure 1:
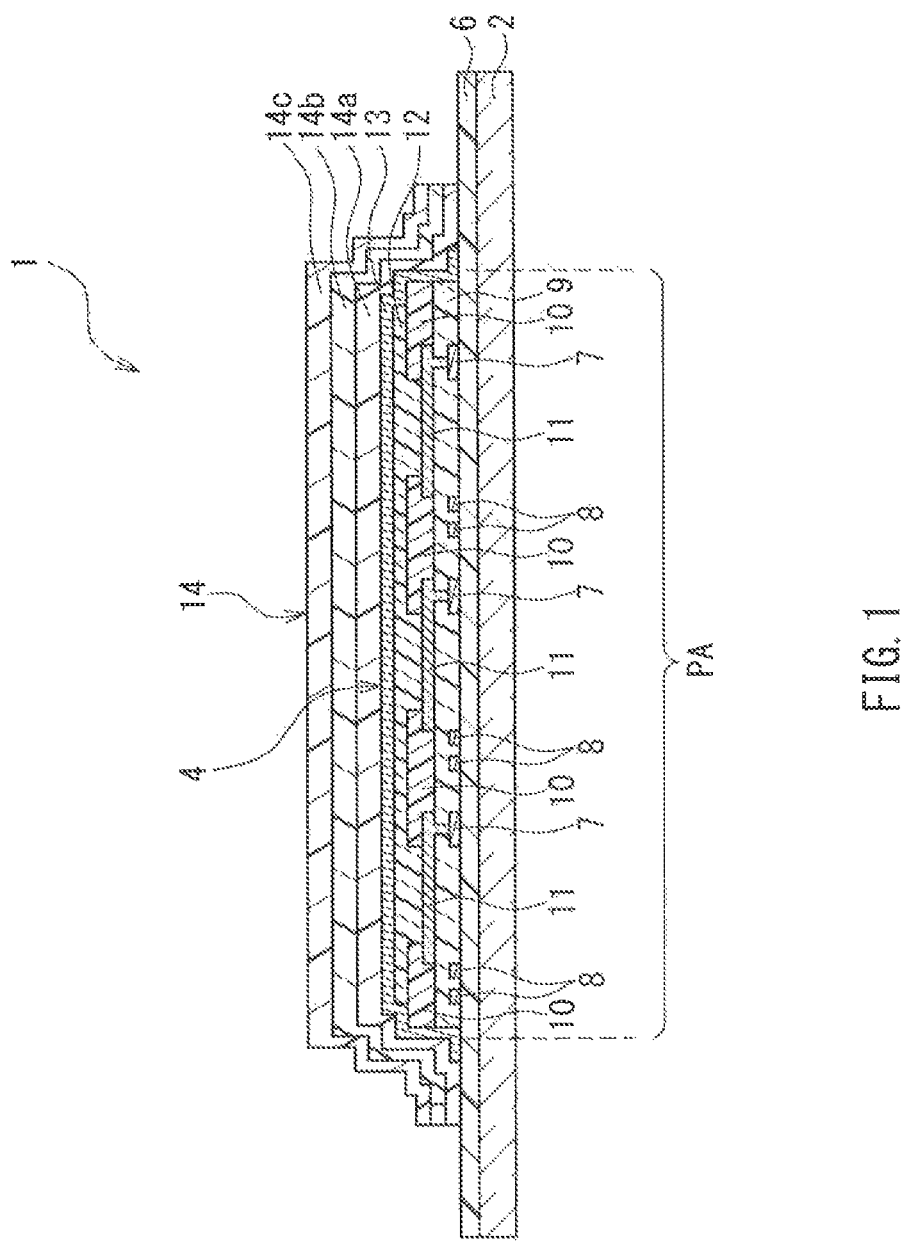
FIG. 1 is a cross-sectional view showing the cross section of an organic EL display device according to Embodiment 1 of the present invention.

Hereinafter, preferred embodiments referring to an electroluminescent device of the present invention and a method for producing the same will be described with reference to attached drawings. In the descriptions below, the present invention is applied to an organic EL display device. The dimensions of constituent members and the dimensional proportions of the members in the drawings are not intended to faithfully represent the actual dimensions of the constituent members and the dimensional proportions of the members.

Embodiment 1

FIG. 1 is a cross-sectional view showing the cross section of an organic EL display device according to Embodiment 1 of the present invention. In FIG. 1, an organic EL display device 1 of this embodiment includes a TFT substrate (substrate) 2 and an organic EL element (electroluminescent element) 4 provided on the TFT substrate 2.

In the organic EL display device 1 of this embodiment, the organic EL element 4 forms a rectangular pixel region PA having a plurality of pixels (including a plurality of sub-pixels), and the organic EL element 4 is sealed by a sealing film 14. The pixel region PA is a display portion of the organic EL display device 1 and displays information. In the pixel area PA, as detailed later, a plurality of pixels (a plurality of sub-pixels) are arranged in a matrix, and the pixel area PA displays information by light emission of the sub-pixels of the organic EL element 4.

Further, in FIG. 1, the TFT substrate 2 is made of, e.g., a glass material or a film having flexibility (bendability). An underlying film (insulating film) 6 is formed on the TFT substrate 2 to cover the entire surface of the TFT substrate 2. As illustrated in FIG. 1, in the organic EL display device 1, TFTs (thin film transistors) 7 are provided on the underlying film 6 so as to correspond to each sub-pixel in the pixel region PA. Moreover, lines 8 are formed on the underlying film 6. The lines 8 include a plurality of source lines (signal lines) and a plurality of gate lines that are arranged in a matrix. The source lines are connected to a source driver (not shown) and the gate lines are connected to a gate driver (not shown). With this configuration, the TFTs 7 are driven on a sub-pixel basis in accordance with an external input image signal. The TFTs 7 function as switching elements that control the light emission of the corresponding sub-pixels. Thus, the TFTs 7 control the light emission of any of red (R), green (G), and blue B sub-pixels of the organic EL element 4.

The underlying film 6 prevents the properties of the TFTs 7 from being reduced due to diffusion of impurities from the TFT substrate 2 to the TFTs 7. If there is no concern for such a reduction in the properties of the TFTs 7, then the formation of the underlying film 6 may be omitted.

When the TFT substrate 2 is a film having flexibility, the TFT substrate 2 prevents moisture or oxygen from permeating (entering) the element from the outside, and thus prevents the degradation of the TFTs 7 and the organic EL element 4. A moisture proof layer made of an inorganic film such as silicon nitride or silicon oxynitride may be formed on the TFT substrate 2 in advance.

As shown in FIG. 1, an interlayer insulating film 9, an edge cover 10, and a first electrode 11 of the organic EL element 4 are formed on the TFT substrate 2. The interlayer insulating film 9 functions as a planarization film and is formed on the underlying film 6 to cover the TFTs 7 and the lines 8. The edge cover 10 is formed on the interlayer insulating film 9 to cover the pattern edges of the first electrode 11. The edge cover 10 also functions as an insulating layer to prevent a short circuit between the first electrode 11 and a second electrode 13 (described later). Moreover, the first electrode 11 is connected to the TFTs 7 via contact holes provided in the interlayer insulating film 9.

The edge cover 10 has openings, through which the first electrode 11 is exposed, and these portions substantially form light emitting regions of the organic EL element 4. As described above, the organic EL display device 1 of this embodiment is configured to perform full-color display by emitting light of any color of RGB. The organic EL display device 1 of this embodiment is an active matrix type display device having TFTs (thin film transistors) 7.

As shown in FIG. 1, an organic EL layer 12 and a second electrode 13 are formed on the first electrode 11. The first electrode 11, the organic EL layer 12, and the second electrode 13 constitute the organic EL element 4. The organic EL element 4 is, e.g., a light emitting element that is driven by low voltage direct current and can emit high-intensity light. The organic EL element 4 includes the first electrode 11, the organic EL layer 12, and the second electrode 13.

Specifically, when the first electrode 11 is a positive electrode, a hole injection layer, a hole transport layer, a light emitting layer, an electron transport layer, an electron injection layer, etc. (not shown) are formed in this order on the first electrode 11 as the organic EL layer 12, on top of which the second electrode (negative electrode) 13 is formed. Other than the above description, a single layer may have two or more functions such as a hole injection and transport layer. Moreover, a carrier blocking layer or the like may be appropriately inserted into the organic EL layer 12.

On the other hand, when the second electrode 13 is a positive electrode, the order in which the layers are stacked as the organic EL layer 12 is reversed.

When the first electrode 11 is a permeable electrode or a semi-permeable electrode, and the second electrode 13 is a reflecting electrode, the organic EL display device 1 is a bottom emission type device that emits light from the TFT substrate 2 side. In the bottom emission type organic EL display device 1, the surface of the first electrode 11 on the TFT substrate 2 side is substantially a light emitting surface of the organic EL element 4 to emit light to the outside.

On the contrary, when the first electrode 11 is a reflecting electrode, and the second electrode 13 is a permeable electrode or a semi-permeable electrode, the organic EL display device 1 is a top emission type device that emits light from the sealing film 14. In the top emission type organic EL display device 1, the surface of the first electrode 11 on the sealing film 14 side is substantially a light emitting surface of the organic EL element 4 to emit light to the outside.

In the organic EL display device 1 of this embodiment, the organic EL element 4 is sealed by the sealing film 14, as described above. The sealing film 14 prevents moisture or oxygen from permeating (entering) the element from the outside, thereby preventing the degradation of the organic EL element 4.

The sealing film 14 is formed of a plurality of sealing layers (e.g., three sealing layers). As exemplified in FIG. 1, the sealing film 14 has a layered structure composed of an inorganic layer 14a provided on the organic EL element 4, an organic layer 14b provided on the inorganic layer 14a, and an inorganic layer 14c provided on the organic layer 14b.

The inorganic layers 14a and 14c are made of e.g., silicon nitride, silicon oxide, silicon oxynitride, or aluminum oxide. The organic layer 14b is made of, e.g., organic silicon (organosilicon) such as polysiloxane or silicon oxycarbide, acrylate, polyurea, parylene, polyimide, or polyamide. As detailed later, the inorganic layers 14a, 14c and the organic layer 14b are formed using a mask of the same size, so that their external forms coincide with each other.

In the organic EL display device 1 of this embodiment, since the inorganic layer 14a is provided on the organic EL element 4, the inorganic layer 14a can prevent adverse effects of moisture to the organic EL element 4 reliably. Further, since the organic layer 14b is provided on the inorganic layer 14a, the organic layer 14b can cover the stress relaxation of the inorganic layer 14a or damages in the inorganic layer 14a such as pinholes or defects by foreign matters, and thus prevents the degradation of the sealing property of the sealing film 14 more reliably.

In the organic EL display device 1 of this embodiment, in the organic layer 14b, the peripheral portion (at least a portion outside the pixel region PA) has a lower carbon content than the central portion (at least a portion of the pixel region PA), and thus reduces the entrance of moisture from the end face of the peripheral portion exposed to the outside (detailed later).

Next, the pixel region PA of the organic EL display device 1 of this embodiment will be described specifically with reference to FIG. 2.

Figure 2:
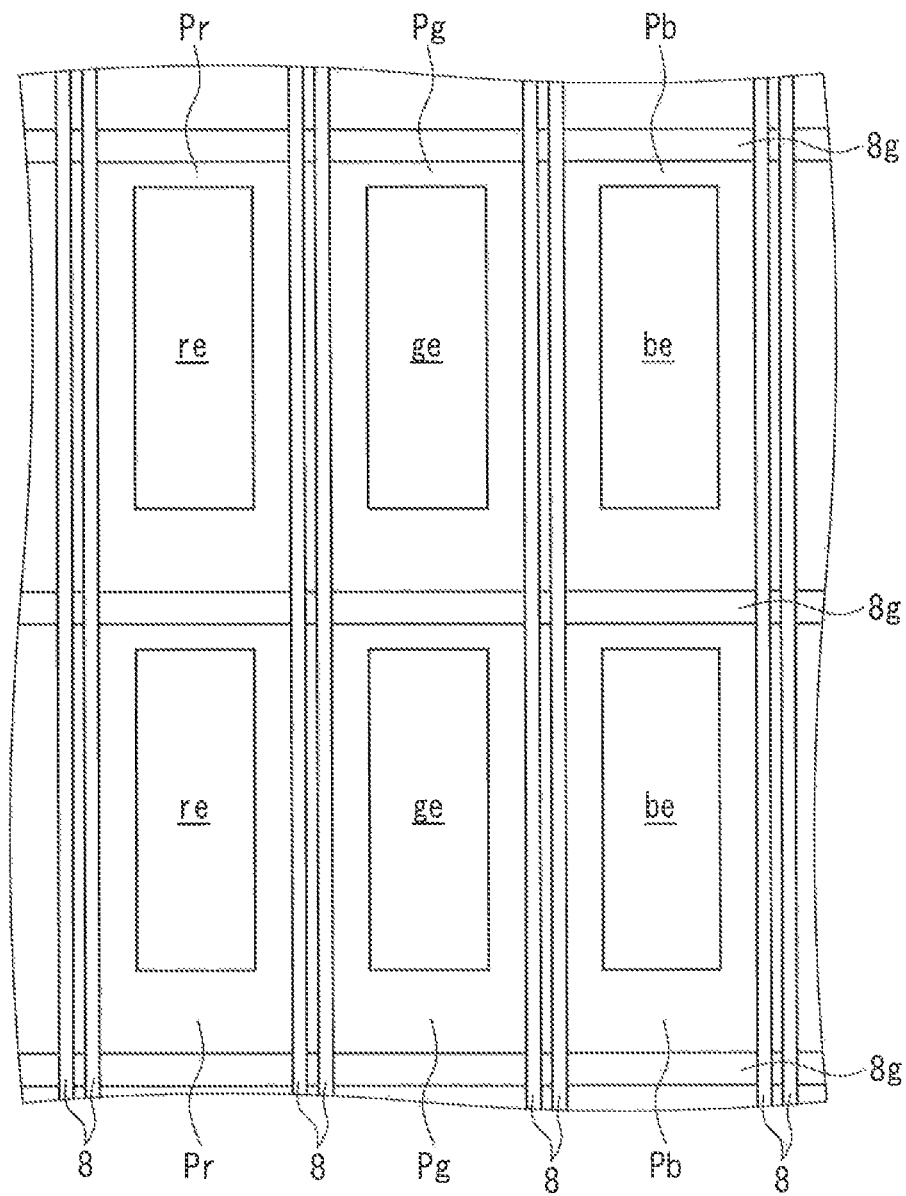
FIG. 2 is an enlarged plan view illustrating the pixel configuration of the organic EL display device.

FIG. 2 is an enlarged plan view illustrating the pixel configuration of the organic EL display device.

As shown in FIG. 2, in the organic EL display device 1 of this embodiment, the pixel region PA (FIG. 1) includes a red sub-pixel Pr, a green sub-pixel Pg, and a blue sub-pixel Pb (hereinafter, also referred to as sub-pixels P collectively) that are arranged in a matrix and that emit red (R) light, green (G) light, and blue (B) light, respectively. Each of the sub-pixels P is partitioned by the two lines 8 and a gate line 8g connected to the gate of the TFT 7. The size of a pixel region of each of the sub-pixels P in the horizontal direction of FIG. 2 is a size between a center line of two adjacent lines 8 and a center line of another two adjacent lines 8 that are positioned next to the two adjacent lines 8 in the horizontal direction of FIG. 2. The size thereof in the vertical direction of FIG. 2 is a size between centers of two gate lines 8g next to each other. In each of the sub-pixels P, an area of the pixel region is defined by the size in the horizontal direction and the size in the vertical direction of FIG. 2.

In the pixel region PA, a pair of the red sub-pixel Pr, the green sub-pixel Pg, and the blue sub-pixel Pb constitutes one pixel.

In the red sub-pixel Pr, a portion of the edge cover 10 that is exposed from an opening re substantially forms a light emitting region of the red sub-pixel Pr. Similarly, in the green sub-pixel Pg, a portion of the edge cover 10 that is exposed from an opening ge substantially forms a light emitting region of the green sub-pixel Pg. In the blue sub-pixel Pb, a portion of the edge cover 10 that is exposed from an opening be substantially forms a light emitting region of the blue sub-pixel Pb.

Subsequently, the organic layer 14b in the organic EL display device 1 of this embodiment will be described specifically with reference to FIGS. 3 and 4.

Figure 3:
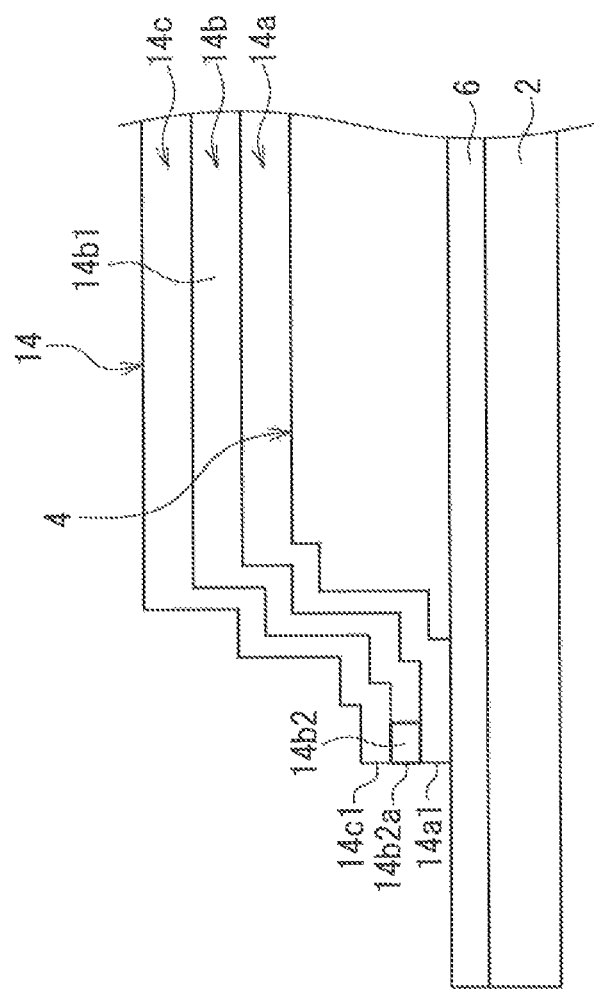
FIG. 3 is a view illustrating the configuration of main portions of a sealing film provided in the organic EL display device.

FIG. 3 is a view illustrating the configuration of main portions of a sealing film provided in the organic EL display device. FIG. 4 is a plan view illustrating the specific configuration of an organic layer included in the sealing film.

Figure 4:
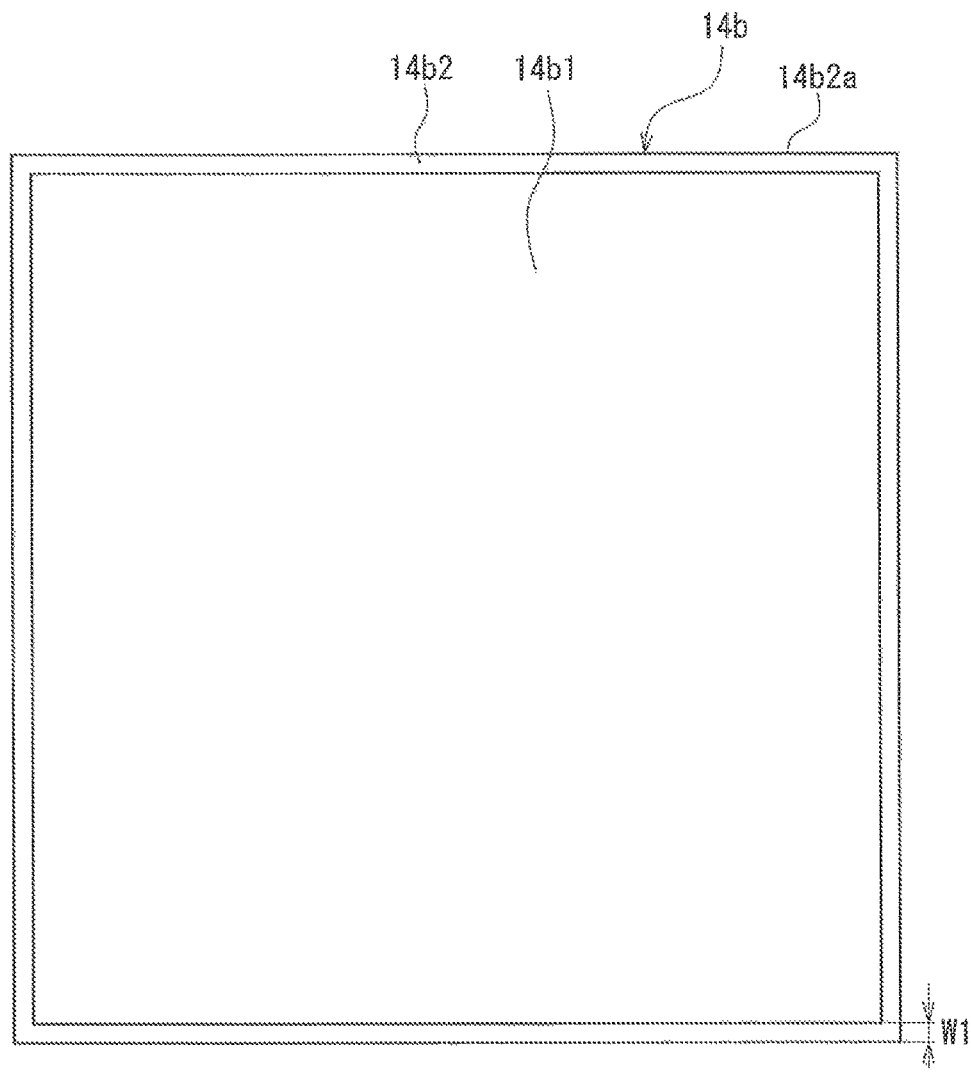
FIG. 4 is a plan view illustrating the specific configuration of an organic layer included in the sealing film.

As shown in FIGS. 3 and 4, the organic layer 14b includes a central portion 14b1 and a peripheral portion 14b2 that is located around the central portion 14b1. As detailed later, the central portion 14b1 and the peripheral portion 14b2 have different carbon contents by irradiation of the peripheral portion 14b2 with laser light.

As described above, in the sealing film 14, the inorganic layer 14a, the organic layer 14b, and the inorganic layer 14c are formed using a mask of the same size, so that an end face 14a1 of the inorganic layer 14a, an end face 14b2a of the organic layer 14b, and an end face 14c1 of the inorganic layer 14c form a straight line, as shown in FIG. 3. The end faces 14a1, 14b2a, and 14c1 are exposed to the outside.

Figure 8:
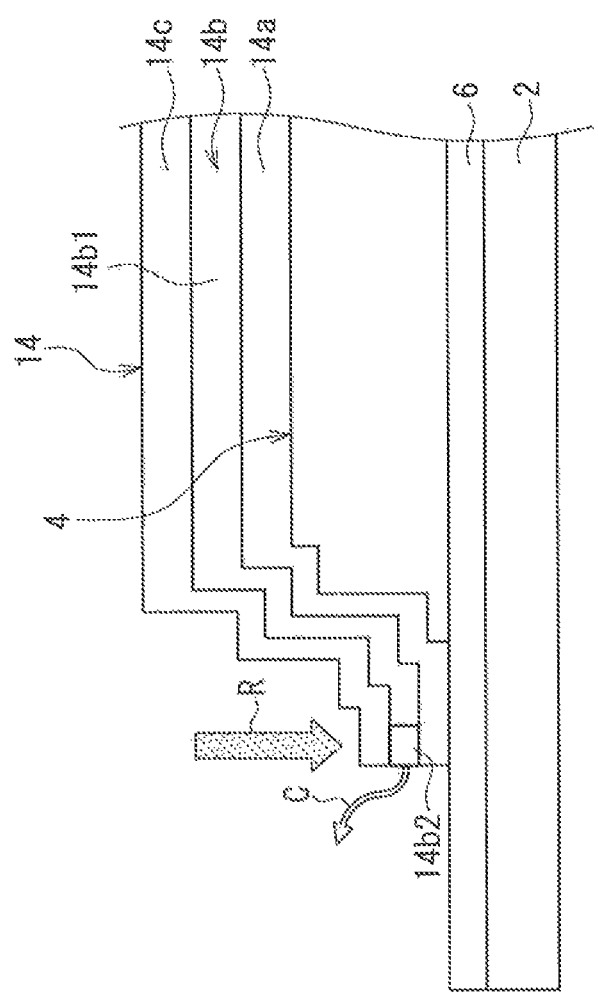
FIG. 8 is a view illustrating a laser light irradiation step shown in FIG. 5.

Next, the method for producing the organic EL display device 1 of this embodiment will be described specifically with reference to FIG. 5 or 8.

Figure 5:
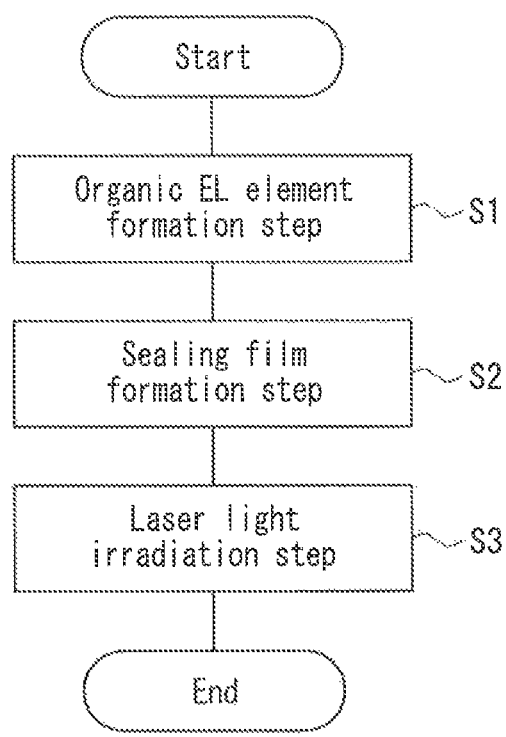
FIG. 5 is a flowchart showing the production steps of the organic EL display device.
Figure 6:
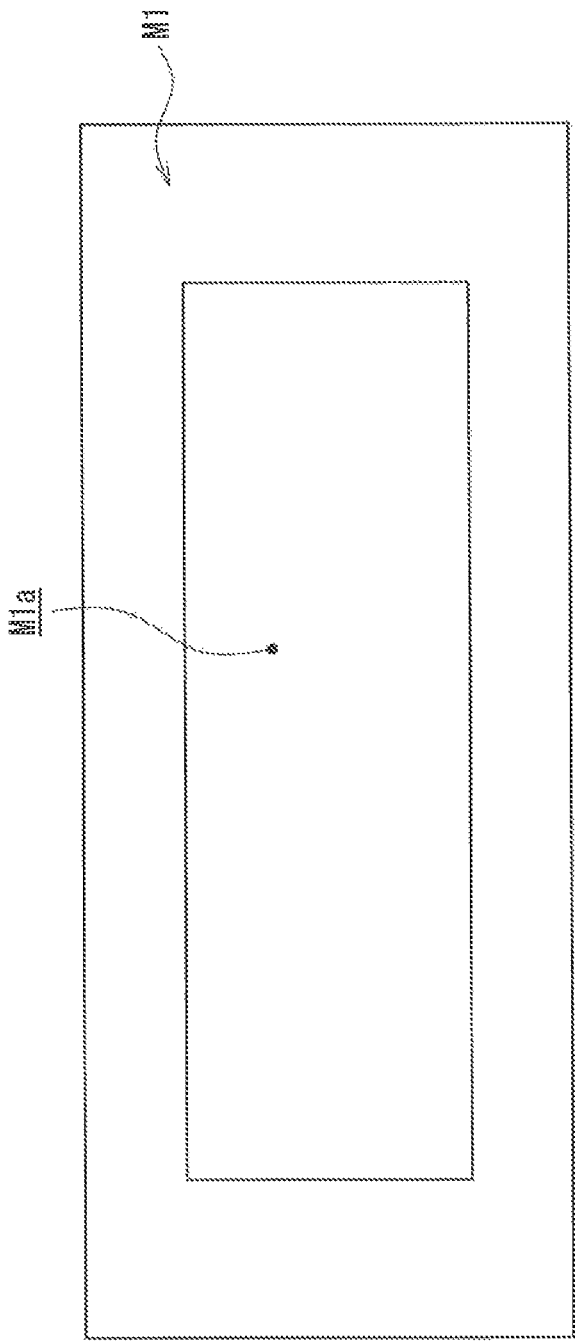
FIG. 6 is a plan view illustrating a mask to be used in a sealing film formation step shown in FIG. 5.
Figure 7A:
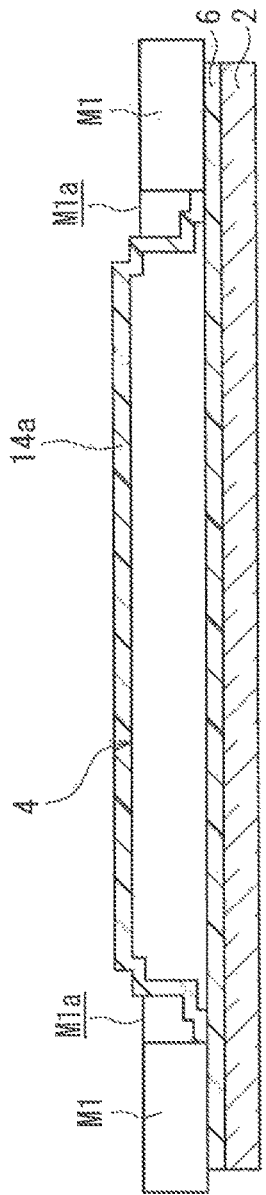
FIG. 7A to FIG. 7C illustrate a series of main production steps.
Figure 7B:
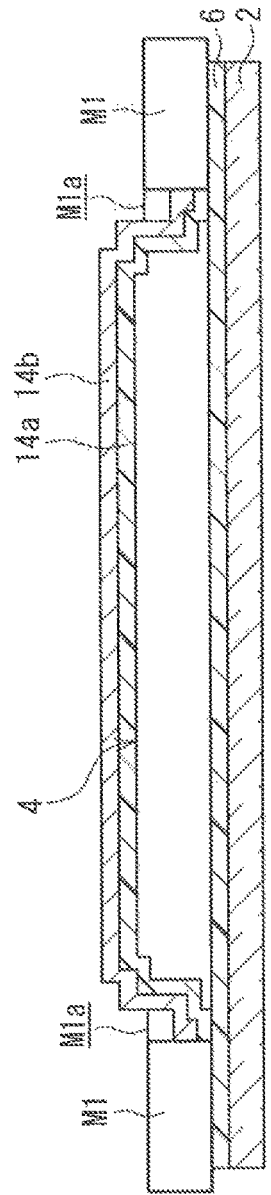
Figure 7C:
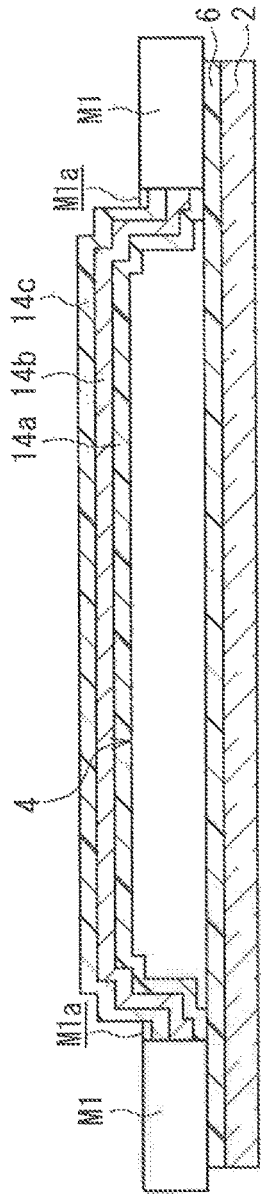

FIG. 5 is a flowchart showing the production steps of the organic EL display device. FIG. 6 is a plan view illustrating a mask to be used in a sealing film formation step shown in FIG. 5. FIG. 7 is a view illustrating the specific production steps of the sealing film formation step, and FIG. 7A to FIG. 7C illustrate a series of main production steps. FIG. 8 is a view illustrating a laser light irradiation step shown in FIG. 5.

As shown in a step S1 in FIG. 5, in the organic EL display device 1 of this embodiment, first, an organic EL element formation step of forming the organic EL element 4 on the TFT substrate 2 is performed. In the organic EL element formation step, the constituent elements of the organic EL element 4 including the TFTs 7 and the lines 8 are formed sequentially on the underlying film 6 provided on the TFT substrate 2.

Next, as shown in a step S2 in FIG. 5, a sealing film formation step of forming, on the organic EL element 4, the sealing film 14 that seals the organic EL element 4 is performed. In the sealing film formation step, the inorganic layers 14a and 14c of the sealing film 14 are formed using, e.g., a CVD method, a sputtering method, or an ALD (Atomic Layer Deposition) method. Particularly, a case where the CVD method or the ALD method is used is preferred because a high step covering property is obtained, and more appropriate inorganic layers 14a and 14c can be formed.

The organic layer 14b is formed using, e.g., a CVD method, a sputtering method, a vapor deposition method, or a vapor deposition polymerization method. Particularly, when the CVD method or the sputtering method is used, the organic layer 14b can be formed in the same chamber as the inorganic layers 14a and 14c. Thus, the inorganic layer 14a, and the organic layer 14b, and the inorganic layer 14c can be formed sequentially using the same mask, with the mask being attached to the TFT substrate 2.

In the sealing film formation step, the inorganic layer 14a, the organic layer 14b, and the inorganic layer 14c are formed using a mask M1 shown in FIG. 6. Specifically, as shown in FIG. 6, the mask M1 has an opening M1a, within which the organic EL element 4 formed on the TFT substrate 2 is arranged.

As shown in FIG. 7A, the inorganic layer 14a is formed to cover the organic EL element 4.

Next, as shown in FIG. 7B, the organic layer 14b is formed on the inorganic layer 14a.

Then, as shown in FIG. 7C, the inorganic layer 14c is formed on the organic layer 14b.

Subsequently, as shown in a step S3 in FIG. 5, a laser light irradiation step of irradiating the peripheral portion of the sealing film 14 with laser light is performed. In the laser light irradiation step, the peripheral portion of the sealing film 14 is irradiated with, e.g., infrared laser light. The peripheral portion of the sealing film 14 is irradiated with infrared laser light, as indicated by "R" in FIG. 8. Thus, in the organic layer 14b, a carbon-based gas containing carbon is emitted (vaporizes) from the peripheral portion 14b2 to the outside, as indicated by "C" in FIG. 8.

Specifically, the irradiation with infrared laser light increases the temperature of the peripheral portion 14b2 of the organic layer 14b, and this causes thermal decomposition. When the organic layer 14b is formed using a carbon-based gas such as a carbonic acid gas or organic silicon such as polysiloxane, a carbon-based gas such as methane or siloxane that contains a methyl group in the side chain is emitted to the outside.

As a result, in the organic layer 14b, the carbon content of the peripheral portion 14b2 is, e.g., 85% or less of that of the central portion 14b1 based on a C—H bond ratio of Fourier Transform Infrared Spectroscopy (FT-IR).

The carbon content of the central portion 14b1 and the carbon content of the peripheral portion 14b2 are measured based on, e.g., the bonding amount of carbon components of Fourier Transform Infrared Spectroscopy (FT-IR), or the atomic composition analysis in X-ray photoelectron spectroscopy (XPS).

By performing the laser light irradiation step, in the peripheral portion 14b2 of the organic layer 14b, a low-carbon-content region that has a lower carbon content than the central portion 14b1 of the organic layer 14b is formed in a frame shape in a predetermined width (indicated by "W1" in FIG. 4) from the end face 14b2a of the organic layer 14b, as shown in FIG. 4.

The specific width W1 of the peripheral portion (low-carbon-content region) 14b2 is about 3 μm to 500 μm.

An effect of the peripheral portion 14b2 of the organic layer 14b will be described specifically with reference to FIG. 9.

Figure 9A:
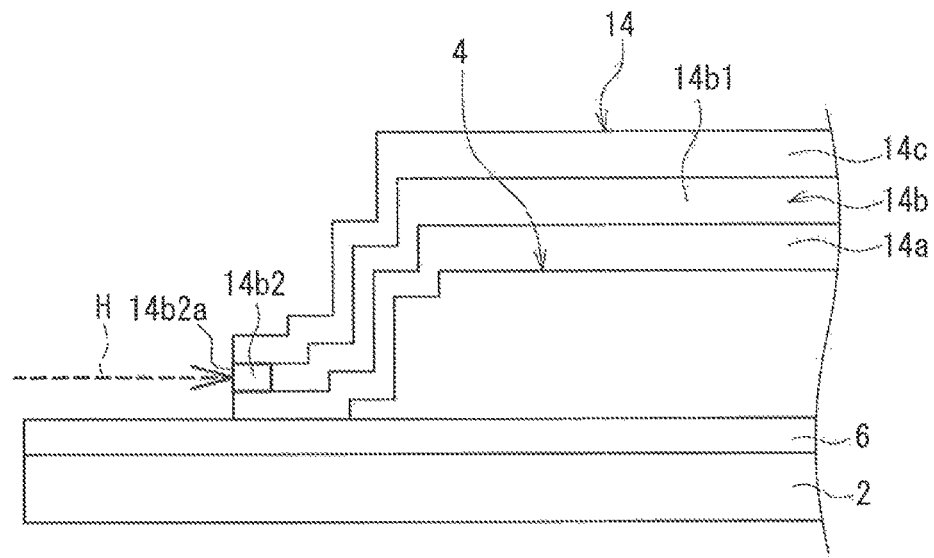
FIG. 9A is a view specifically illustrating an effect of a peripheral portion of the organic layer.
Figure 9B:
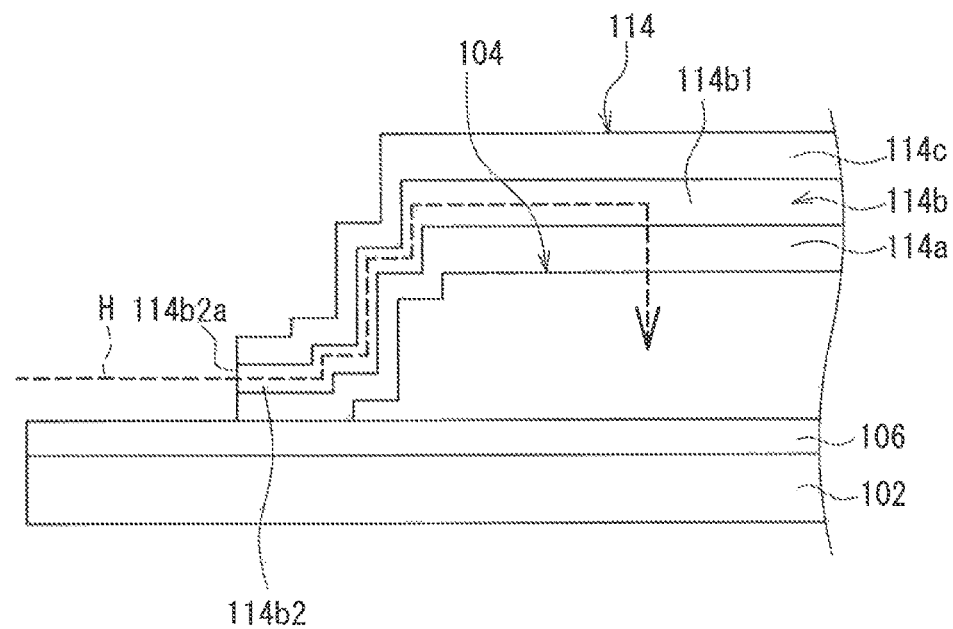
FIG. 9B is a view illustrating a problem in a comparative example.

FIG. 9A is a view specifically illustrating an effect of the peripheral portion of the organic layer, and FIG. 9B is a view illustrating a problem in a comparative example.

As shown in FIG. 9A, in the organic EL display device 1 of this embodiment, although the end face of the peripheral portion 14b2 of the organic layer 14b is exposed to the outside, the peripheral portion 14b2 has a lower carbon content than the central portion 14b1 as described above. Specifically, the amount of carbon components, which are highly permeable to moisture, is reduced in the peripheral portion 14b2, and thus the moisture permeability of the peripheral portion 14b2 is greatly lowered. Consequently, the peripheral portion 14b2 greatly reduces the entrance of moisture from the outside, and reduces the entrance of moisture from the end face 14b2a of the organic layer 14b to the inside and accordingly to the organic EL element 4, as indicated by "H" in FIG. 9A.

On the other hand, in comparative example, moisture from the outside sometimes enters an organic layer 114b from the end face of the organic layer 114b and reaches an organic EL element 104, as indicated by "H" in FIG. 9B. In this comparative example, the organic EL element 104 is formed on an underlying film 106 that is provided on a TFT substrate 102, and a sealing film 114 composed of an inorganic layer 114a, an organic layer 114b, and an inorganic layer 114c covers the organic EL element 104. In the comparative example, since the peripheral portion of the sealing film 114 is not irradiated with laser light, the carbon content in the organic layer 114b is almost uniform over the entire surface, i.e., the carbon content of a central portion 114b1 and the carbon content of an peripheral portion 114b2 in the organic layer 114b are almost the same. As a result, in the comparative example, moisture sometimes enters from an end face 114b2a of the peripheral portion 114b2 of the organic layer 114b, and the moisture entered passes through the inside of the organic layer 114b and the inorganic layer 114a and then reaches the organic EL element 104. Because of this, the organic EL element 104 may degrade due to moisture in the comparative example.

According to an experiment conducted by the inventors of this invention, the moisture permeability of the peripheral portion 14b2 was changed as shown in Table 1 below by changing the carbon content of the peripheral portion 14b2 of the organic layer 14b. The moisture permeability was determined by a calcium test. In the calcium test, calcium was evaporated on a glass substrate to form a 70 nm-thick film, on which a layer having the same carbon content as the central portion 14b1 and a layer having the same carbon content as the peripheral portion 14b2 were formed. The layers were left under constant temperature and humidity. The amount of moisture permeated through the layer was evaluated based on the change of the calcium layer (Ca change rate). The carbon content was evaluated based on the C—H bond ratio of Fourier Transform Infrared Spectroscopy (FT-IR).

TABLE 1

| Carbon content | Ca change rate |
| --- | --- |
| 100% | 100% |
| 85% | 77% |

As is clear from Table 1, when the carbon content of the central portion 14b1 was assumed to be 100%, and the carbon content of the peripheral portion 14b2 was 85% or less, the moisture permeability of the peripheral portion 14b2 was 77% or less of that of the central portion 14b1. It was confirmed that the thus configured peripheral portion 14b2 can reduce the entrance of moisture from the end face of the peripheral portion 14b2.

In the thus configured organic EL display device 1 of this embodiment, the sealing film 14 seals the organic EL element (electroluminescent element) 4 and has a layered structure composed of the organic layer 14b and the inorganic layers 14a, 14c. In the sealing film 14, the peripheral portion 14b2 of the organic layer 14b has a lower carbon content than the central portion 14b1 of the organic layer 14b. Thus, in the organic EL display device 1 of this embodiment, unlike the above conventional example, even when the end face of the organic layer 14b of the sealing film 14 is exposed to the outside, it is possible to reduce the entrance of moisture into the organic layer 14. As a result, in this embodiment, the sealing property of the sealing film 14 can be improved, and a highly reliable organic EL display device (electroluminescent device) 1 can be configured.

In this embodiment, since the sealing film 14 can be formed sequentially in a state where the end face 14b2a of the organic layer 14b in the sealing film 14 is exposed to the outside, the organic layer 14b and the inorganic layers 14a, 14c included in the sealing film 14 can be formed using a mask of the same size. Thus, the production steps of the organic EL display device 1 can be simplified, and the productivity of the organic EL display device 1 can be improved easily.

In this embodiment, in the peripheral portion 14b2 of the organic layer 14b, the low-carbon-content region that has a lower carbon content than the central portion 14b1 of the organic layer 14b is formed in a frame shape in a predetermined width from the end face 14b2a of the organic layer 14b. Therefore, even when the end face 14b2a of the organic layer 14b of the sealing film 14 is exposed to the outside, it is possible to reduce the entrance of moisture into the organic layer 14b reliably.

In this embodiment, the carbon content of the peripheral portion 14b2 of the organic layer 14b is 85% or less of that of the central portion 14b1 of the organic layer 14b based on the C—H bond ratio of Fourier Transform Infrared Spectroscopy (FT-IR). Therefore, even when the end face of the organic layer 14b of the sealing film 14 is exposed to the outside, it is possible to reduce the entrance of moisture into the organic layer 14b, and thus improve the sealing property of the sealing film 14 reliably.

In this embodiment, in the sealing film 14, the carbon content of the peripheral portion 14b2 of the organic layer 14b is reduced by irradiating the peripheral portion with laser light. Thus, the carbon content of the peripheral portion 14b2 of the organic layer 14b can be reduced reliably.

Moreover, in this embodiment, in the sealing film formation step, the inorganic layer 14a, the organic layer 14b, and the inorganic layer 14c are formed using the mask M1 of the same size, so that the inorganic layer 14a, the organic layer 14b, and the inorganic layer 14c can be formed sequentially, as shown in FIG. 7A or 7C. Thereby, it is possible to prevent the formation of gaps in interfaces between the inorganic layer 14a, the organic layer 14b and the inorganic layer 14c, and the contamination of foreign matters. It also is possible to prevent the impairment of the production cycle time of the sealing film 14, and to reduce the amount of gas used in the production. Moreover, it is possible to easily narrow the frame of the organic EL display device 1.

Embodiment 2

Figure 10:
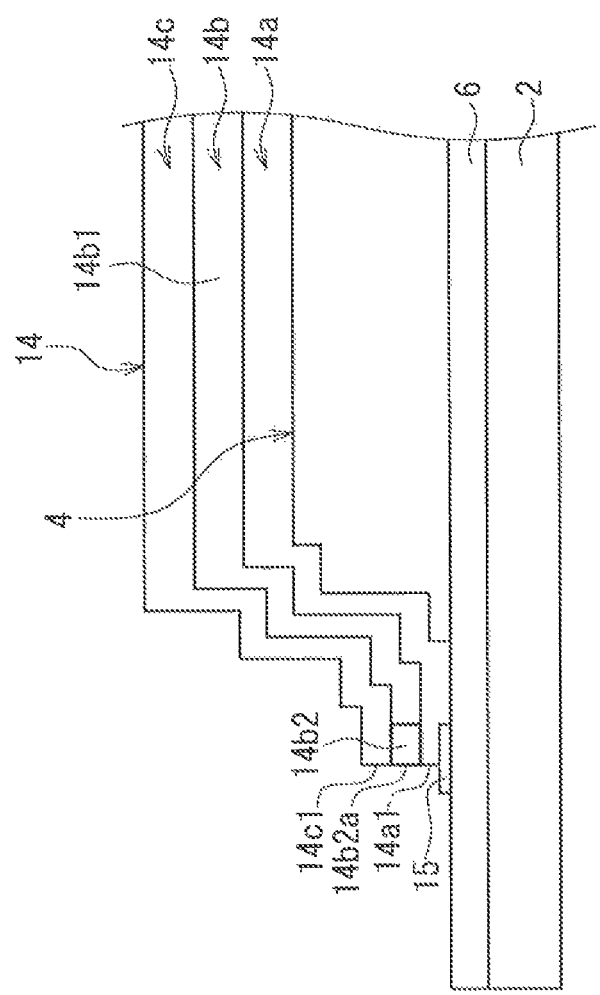
FIG. 10 is a view illustrating the configuration of main portions of an organic EL display device according to Embodiment 2 of the present invention.
Figure 11:
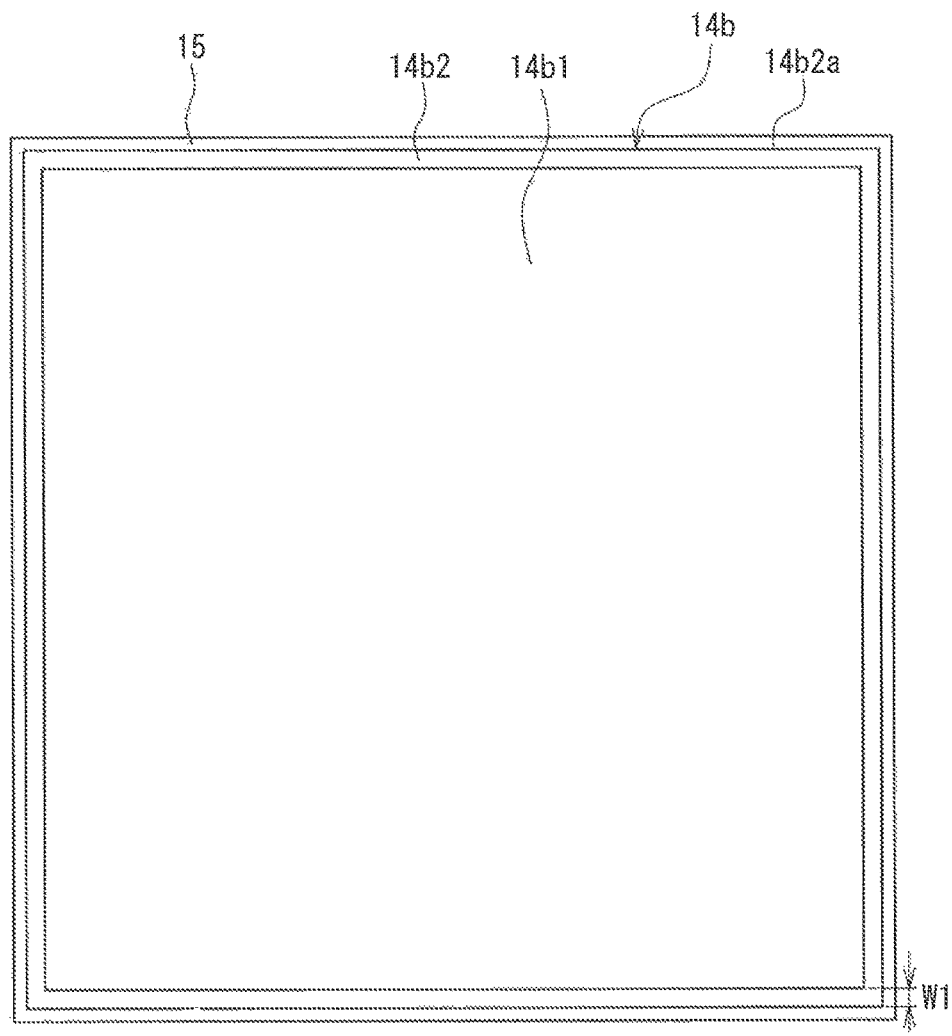
FIG. 11 is a plan view illustrating the specific configuration of an organic layer included in a sealing film shown in FIG. 10 and a photothermal conversion layer.

FIG. 10 is a view illustrating the configuration of main portions of an organic EL display device according to Embodiment 2 of the present invention. FIG. 11 is a plan view illustrating the specific configuration of an organic layer included in a sealing film shown in FIG. 10 and a photothermal conversion layer.

In FIGS. 10 and 11, this embodiment mainly differs from Embodiment 1 in that a photothermal conversion layer is provided at least part of a peripheral portion of the sealing film. The same components as those of Embodiment 1 are denoted by the same reference numerals, and the explanation will not be repeated.

As shown in FIG. 10, in an organic EL display device 1 of this embodiment, a photothermal conversion layer 15 is provided between an underlying film 6 and a sealing film 14. The photothermal conversion layer 15 is formed in a frame shape under a peripheral portion 14b2 of an organic layer 14b to surround the peripheral portion 14b2, as shown in FIG. 11. The photothermal conversion layer 15 is provided on the upper side of the lines 8 (FIG. 1), i.e., on the organic layer 14b side.

The photothermal conversion layer 15 is made of e.g., a metal film such as a molybdenum film. Upon irradiation of the peripheral portion of the sealing film 14 with infrared laser light, the photothermal conversion layer 15 absorbs the infrared laser light, converts it into heat efficiently, and gives the converted heat to the peripheral portion 14b2 of the organic layer 14b.

The method for producing the organic EL display device 1 of this embodiment will be described specifically with reference to FIG. 12.

Figure 12:
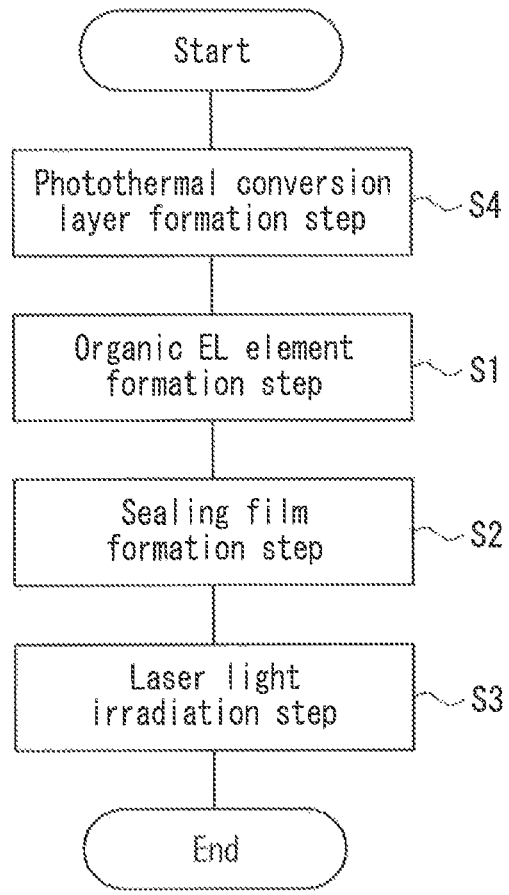
FIG. 12 is a flowchart showing the production steps of the organic EL display device shown in FIG. 10.

FIG. 12 is a flowchart showing the production steps of the organic EL display device shown in FIG. 10.

As shown in a step S4 in FIG. 12, in the organic EL display device 1 of this embodiment, first, a photothermal conversion layer formation step of forming, on a TFT substrate 2, the photothermal conversion layer 15 at least part of the peripheral portion of the sealing film 14. In the photothermal conversion layer formation step, similarly to the formation of TFTs 7 for example, sputtering, photolithography, and etching are used to form the photothermal conversion layer 15 in a frame shape between the underlying film 6 and the sealing film 14.

Next, as shown in a step S1 in FIG. 12, similarly to the step of Embodiment 1, an organic EL element formation step of forming an organic EL element 4 on the TFT substrate 2 is performed.

Then, similarly to the steps of Embodiment 1, a sealing film formation step and a laser light irradiation step are performed sequentially as shown in steps S2 and S3 in FIG. 12, respectively.

With the above configuration, this embodiment can have the same effects as those of Embodiment 1. In this embodiment, the photothermal conversion layer 15 is provided. The photothermal conversion layer 15 converts laser light into heat, and thus reduces the carbon content of the peripheral portion 14b2 of the organic layer 14b easily, regardless of the type of laser light, as long as the wavelength is absorbable by the photothermal conversion layer 15.

In the above description, the photothermal conversion layer 15 is provided in a frame shape between the underlying film 6 and the sealing film 14. However, the photothermal conversion layer 15 of this embodiment is not limited thereto, as long as it is provided at least part of the peripheral portion of the sealing film 14. For example, a plurality of liner photothermal conversion layers 15 may be provided between the organic layer 14b and the inorganic layer 14c. Note that the above-described case in which the photothermal conversion layer 15 is provided between the underlying film 6 and the sealing film 14 is preferred, in terms of sequentially forming the layers of the sealing film 14.

Other than the above description, the lines 8, which are drawn out from a pixel region PA to the outside, may be configured to function as a photothermal conversion layer.

In this embodiment, since the photothermal conversion layer 15 is provided, it is possible to lower the irradiation output of laser light (infrared laser light) and to use laser light having a shorter wavelength (e.g., ultraviolet ray), which is less likely to be absorbed and converted into heat in the peripheral portion, as compared with the configuration of Embodiment 1.

Embodiment 3

Figure 13:
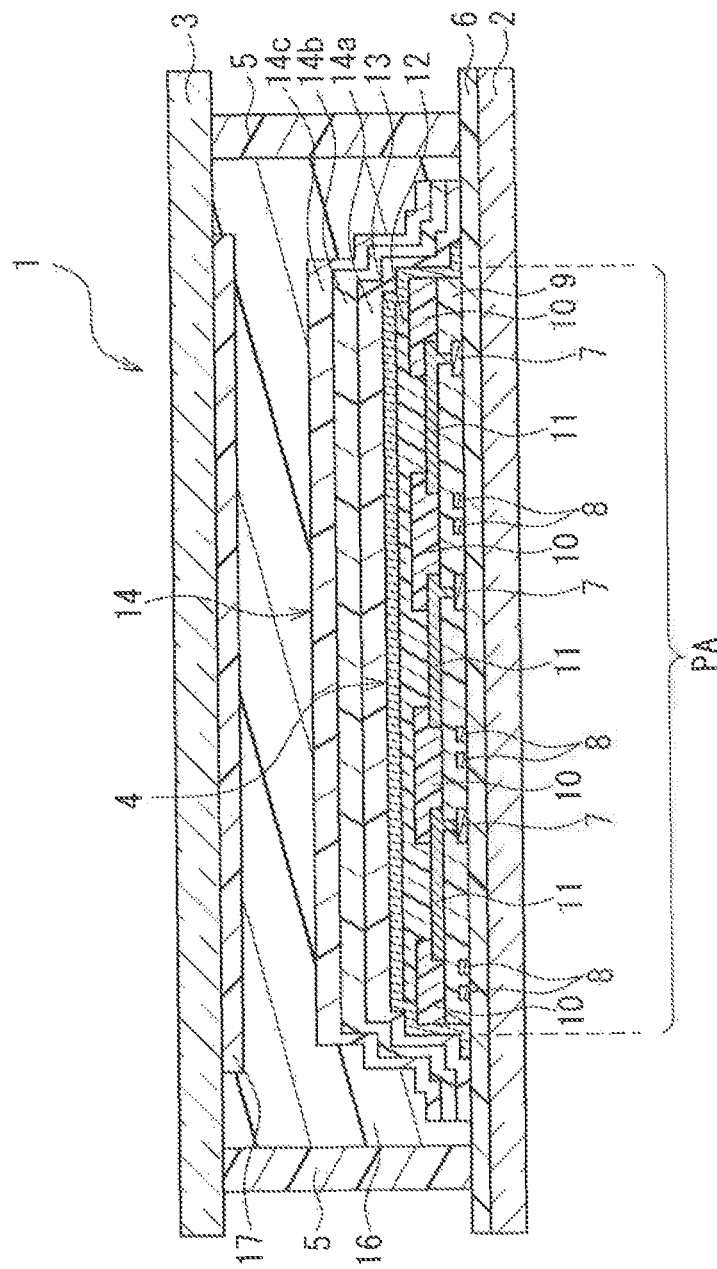
FIG. 13 is a cross-sectional view showing the cross section of an organic EL display device according to Embodiment 3 of the present invention.
Figure 14:
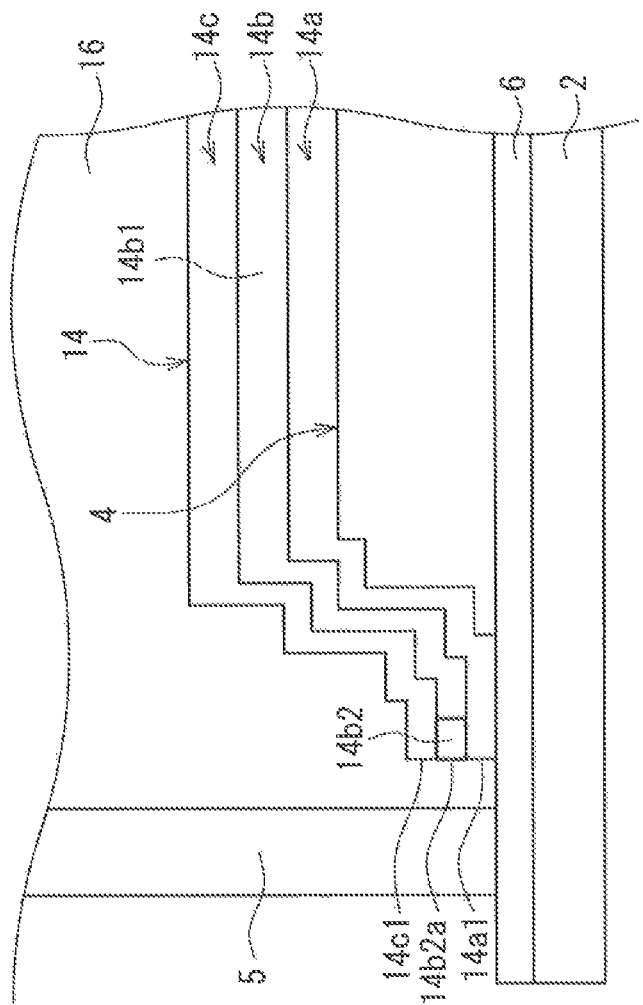
FIG. 14 is a view illustrating the configuration of main portions of the organic EL display device shown in FIG. 13.

FIG. 13 is a cross-sectional view showing the cross section of an organic EL display device according to Embodiment 3 of the present invention. FIG. 14 is a view illustrating the configuration of main portions of the organic EL display device shown in FIG. 13.

In FIGS. 13 and 14, this embodiment mainly differs from Embodiment 1 in that a counter substrate that is located opposite a TFT substrate and a sealing material in a frame shape that seals an organic EL element between the TFT substrate and the counter substrate are provided. The same components as those of Embodiment 1 are denoted by the same reference numerals, and the explanation will not be repeated.

As shown in FIG. 13, in an organic EL display device 1 of this embodiment, an organic EL element 4 is sealed by a TFT substrate 2, a counter substrate 3 that is located opposite the TFT substrate 2, and a sealing material 5 in a frame shape that is provided between the TFT substrate 2 and the counter substrate 3.

Similarly to the TFT substrate 2, the counter substrate 3 is made of, e.g., a glass material or a film having flexibility (bendability). A color filter 17 is provided on the surface of the counter substrate 3 on the organic EL element 4 side to improve light emission characteristics (e.g., light emission quality) of the sub-pixels of RGB.

The sealing material 5 is formed of a resin such as an epoxy resin in which a spacer and inorganic particles are dispersed. The spacer is used to define a cell gap between the TFT substrate 2 and the counter substrate 3. The sealing material 5 is formed in a frame shape around a pixel region PA. Due to the dispersion of the inorganic particles, the moisture permeability of the sealing material 5 can be reduced further.

In the organic EL display device 1 of this embodiment, a filler layer 16 is provided between the TFT substrate 2, the counter substrate 3, and the sealing material 5 so as to cover the organic EL element 4. The filler layer 16 is formed of a resin in which a metal oxide such as aluminum hydroxide or calcium oxide and active carbon are dispersed.

As shown in FIG. 14, in the organic EL display device 1 of this embodiment, similarly to the organic layer 14$b$ of Embodiment 1, the peripheral portion 14$b$2 that has a lower carbon content than the central portion 14$b$1 is formed in the organic layer 14$b$.

With the above configuration, this embodiment can have the same effects as those of Embodiment 1. In this embodiment, the counter substrate 3 that is located opposite the TFT substrate 2 and the sealing material 5 that seals the organic EL element 4 between the TFT substrate 2 and the counter substrate 3 are provided. Thus, this embodiment can more reliably prevent the degradation of the organic EL element 4.

Embodiment 4

Figure 15:
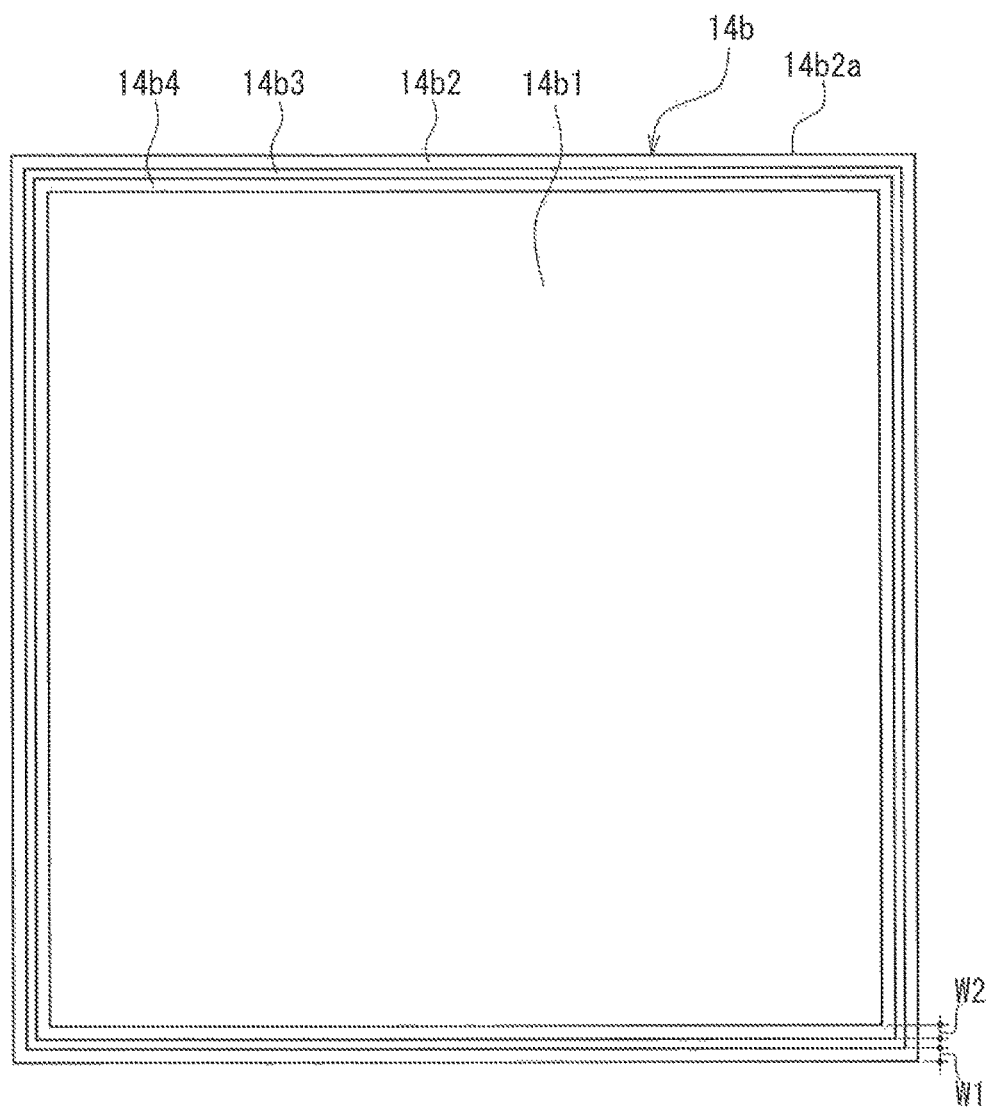
FIG. 15 is a cross-sectional view showing the cross section of an organic EL display device according to Embodiment 4 of the present invention.

FIG. 15 is a cross-sectional view showing the cross section of an organic EL display device according to Embodiment 4 of the present invention.

In FIG. 15, this embodiment mainly differs from Embodiment 1 in that, in a peripheral portion of an organic layer, a first low-carbon-content region that has a lower carbon content than a central portion of the organic layer is formed in a frame shape in a predetermined width from an end face of the organic layer, and a second low-carbon-content region that has a lower carbon content than the central portion is formed in a frame shape in a predetermined width between the central portion and the first low-carbon-content region. The same components as those of Embodiment 1 are denoted by the same reference numerals, and the explanation will not be repeated.

As shown in FIG. 15, in the organic EL display device 1 of this embodiment, in a peripheral portion 14$b$2 of an organic layer 14$b$, a first low-carbon-content region that has a lower carbon content than a central portion 14$b$1 of the organic layer 14$b$ is formed in a frame shape in a predetermined width (indicated by "W1" in FIG. 15) from an end face 14$b$2$a$ of the organic layer 14$b$, which is similar to the organic layer 14$b$ of Embodiment 1.

Inside the first low-carbon-content region, an intermediate portion 14$b$3 that has almost the same carbon content as the central portion 14$b$1 is provided. Moreover, inside the intermediate portion 14$b$3, i.e., between the central portion 14$b$1 and the first low-carbon-content region, a second low-carbon-content region 14$b$4 that has a lower carbon content than the central portion 14$b$1 is formed in a frame shape in a predetermined width (indicated by "W2" in FIG. 15).

In the second low-carbon-content region 14$b$4, similarly to the peripheral portion (first low-carbon-content region) 14$b$2, the corresponding portion of the organic layer 14$b$ is irradiated with laser light to vaporize a carbon-based gas contained therein. Thereby, the second low-carbon-content region 14$b$4 has a lower carbon content than the central portion 14$b$1.

The carbon content of the second low-carbon-content region 14$b$4 is, e.g., almost the same as that of the peripheral portion (first low-carbon-content region) 14$b$2.

Other than the above description, the carbon content of the second low-carbon-content region 14$b$4 may be different from that of the peripheral portion (first low-carbon-content region) 14$b$2.

In this embodiment, the width W1 of the first low-carbon-content region and the width W2 of the second low-carbon-content region 14$b$4 are the same.

With the above configuration, this embodiment can have the same effects as those of Embodiment 1. In this embodiment, in the peripheral portion 14$b$2 of the organic layer 14$b$, the first low-carbon-content region that has a lower carbon content than the central portion 14$b$1 is formed in a frame shape in a predetermined width from the end face 14$b$2$a$ of the organic layer 14$b$, and the second low-carbon-content region 14$b$4 that has a lower carbon content than the central portion 14$b$1 is formed in a frame shape in a predetermined width between the central portion 14$b$1 and the first low-carbon-content region of the organic layer 14$b$. Thereby, even when the first low-carbon-content region is not formed appropriately, the second low-carbon-content region 14$b$4 can reduce the entrance of moisture into the organic layer 14$b$.

Modified Example of Embodiment 4

Figure 16:
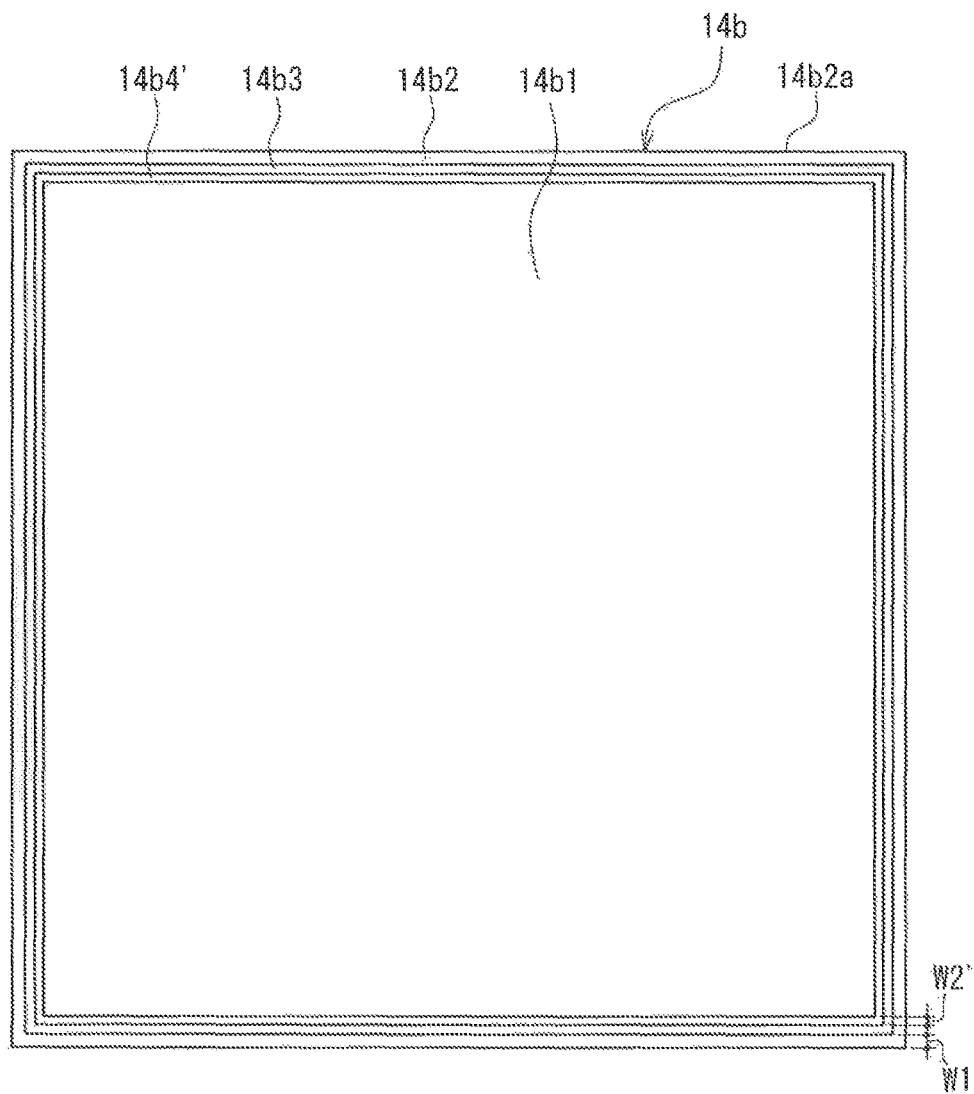
FIG. 16 is a cross-sectional view showing the cross section of a modified example of the organic EL display device shown in FIG. 15.

FIG. 16 is a cross-sectional view showing the cross section of a modified example of the organic EL display device according to Embodiment 4 of the present invention.

In FIG. 16, this embodiment mainly differs from Embodiment 4 in that a width of a second low-carbon-content region is smaller than that of a peripheral portion (first low-carbon-content region). The same components as those of Embodiment 4 are denoted by the same reference numerals, and the explanation will not be repeated.

As shown in FIG. 16, in the organic EL display device 1 of this embodiment, between a central portion 14$b$1 and a peripheral portion (first low-carbon-content region) 14$b$2, a second low-carbon-content region 14$b$4' that has a lower carbon content than the central portion 14$b$1 is formed in a frame shape in a predetermined width (indicated by "W2'" in FIG. 16).

In the second low-carbon-content region 14b4', similarly to the peripheral portion (first low-carbon-content region) 14b2, the corresponding portion of the organic layer 14b is irradiated with laser light to vaporize a carbon-based gas contained therein. Thereby, the second low-carbon-content region 14b4' has a lower carbon content than the central portion 14b1.

The carbon content of the second low-carbon-content region 14b4' is, e.g., almost the same as that of the peripheral portion (first low-carbon-content region) 14b2.

The width W2' of the second low-carbon-content region 14b4' is smaller than the width W1 of the peripheral portion (first low-carbon-content region) 14b2. Specifically, the width W2' is about 2 µm to 500 µm.

With the above configuration, this embodiment can have the same effects as those of Embodiment 4. Moreover, in this embodiment, since the width W2' of the second low-carbon-content region 14b4' is smaller than the width W1 of the peripheral portion 14b2, it is possible to simplify the production steps of the organic EL display device 1.

The above embodiments are all illustrative and not restrictive. The technical scope of the present invention is defined by the appended claims, and all changes that come within the range of equivalency of the claims are intended to be embraced therein.

In the above description, the organic EL element is used as an electroluminescent element. However, the present invention is not limited thereto, and may use, e.g., an inorganic EL element including an inorganic compound.

In the above description, the sealing film composed of an organic layer and two inorganic layers is used. However, the present invention is not limited thereto as long as the sealing film has a layered structure composed of an organic layer and an inorganic layer, and at least a peripheral portion of the organic layer has a lower carbon content than a central portion of the organic layer.

In the above description, the peripheral portion of the organic layer has a lower carbon content than the central portion of the organic layer by laser irradiation. However, the present invention is not limited thereto as long as at least the peripheral portion of the organic layer has a lower carbon content than the central portion of the organic layer. For example, the peripheral portion and the central portion of the organic layer may be formed using materials having different carbon contents.

In the description of Embodiment 1 or 3, in the peripheral portion of the organic layer, a low-carbon-content region that has a lower carbon content than the central portion of the organic layer is formed in a frame shape in a predetermined width from an end face of the organic layer. In the description of Embodiment 4 (including Modified Example of Embodiment 4), in the peripheral portion of the organic layer, a first low-carbon-content region that has a lower carbon content than the central portion of the organic layer is formed in a frame shape in a predetermined width from an end face of the organic layer, and between the central portion and the first low-carbon-content region of the organic layer, a second low-carbon-content region that has a lower carbon content than the central portion of the organic layer is formed in a frame shape in a predetermined width. However, the present invention is not limited thereto as long as a low-carbon-content region that has a lower carbon content than the central portion of the organic layer is formed in at least the peripheral portion of the organic layer, for example, three frame-shaped low-carbon-content regions may be formed from the end face side of the organic layer.

In the above description, infrared laser light is used. However, the laser light of the present invention is not limited thereto, and laser light in a visible light region, laser light having a short wavelength (e.g., ultraviolet ray), etc., can be used.

However, as in the embodiments above, the use of infrared laser light is preferred, regardless of the presence or absence of the photothermal conversion layer, because the infrared laser light can be efficiently absorbed and converted into heat in at least the peripheral portion ((first) low-carbon-content region) of the organic layer, and thus efficiently reduces the carbon content of the at least the peripheral portion of the organic layer.

In the above description, the present invention is applied to the active matrix type organic EL display device having TFTs (thin film transistors) 7. However, the present invention is not limited thereto, and may be applied to, e.g., a passive matrix type organic EL display device without thin film transistors.

In the above description, the present invention is applied to the organic EL display device. However, the present invention is not limited thereto, and may be applied to, e.g., an illuminating device such as a backlight device.

Other than the above description, Embodiments 1 to 4 may be combined as needed. For example, a photothermal conversion layer may be provided at least part of the second low-carbon-content region in Embodiment 4.

INDUSTRIAL APPLICABILITY

The present invention is useful for a highly reliable electroluminescent device that improves the sealing property of a sealing film even when an end face of an organic layer of the sealing film is exposed to the outside, and a method for producing the same.

DESCRIPTION OF REFERENCE NUMERALS

1 Organic EL display device
2 TFT substrate (substrate)
3 Counter substrate
4 Organic EL element (electroluminescent element)
5 Sealing material
14 Sealing film
14a, 14c Inorganic layer
14b Organic layer
14b1 Central portion
14b2 Peripheral portion ((first) low-carbon-content region)
14b2a End face
14b4 Second low-carbon-content region
15 Photothermal conversion layer

The invention claimed is:
1. An electroluminescent device comprising:
a substrate; and
an electroluminescent element provided on the substrate, wherein
the electroluminescent device comprises a sealing film that seals the electroluminescent element,
the sealing film has a layered structure composed of an organic layer and an inorganic layer,
in the sealing film, at least a peripheral portion of the organic layer has a lower carbon content than a central portion of the organic layer,
in the peripheral portion of the organic layer, a first low-carbon-content region that has a lower carbon content than the central portion of the organic layer is defined in a frame shape in a predetermined width from an end face of the organic layer, and between the central portion and the first low-carbon-content region of the organic layer, a second low-carbon-content region that has a lower carbon content than the central portion of the organic layer is defined in a frame shape in a predetermined width.

2. The electroluminescent device according to claim 1, wherein in the sealing film, an end face of the organic layer is exposed to the outside.

3. The electroluminescent device according to claim 1, wherein in the peripheral portion of the organic layer, a low-carbon-content region that has a lower carbon content than the central portion of the organic layer is formed in a frame shape in a predetermined width from an end face of the organic layer.

4. The electroluminescent device according to claim 1, wherein in the organic layer, the width of the second low-carbon-content region is smaller than that of the first low-carbon-content region.

5. The electroluminescent device according to claim 1, wherein the carbon content of the at least the peripheral portion of the organic layer is 85% or less of that of the central portion of the organic layer based on a C—H bond ratio of Fourier Transform Infrared Spectroscopy (FT-IR).

6. The electroluminescent device according to claim 1, comprising:
a counter substrate that is located opposite the substrate; and
a sealing material in a frame shape that is provided between the substrate and the counter substrate and that seals the electroluminescent element together with the substrate and the counter substrate.

7. An electroluminescent device comprising:
a substrate; and
an electroluminescent element provided on the substrate, wherein
the electroluminescent device comprises a sealing film that seals the electroluminescent element,
the sealing film has a layered structure composed of an organic layer and an inorganic layer,
in the sealing film, at least a peripheral portion of the organic layer has a lower carbon content than a central portion of the organic layer,
at least a peripheral portion of the sealing film is irradiated with laser light to reduce the carbon content of the at least the peripheral portion of the organic layer, and
the laser light is infrared laser light.

8. A method for producing the electroluminescent device according to claim 7, the method comprising:
a sealing film formation step of forming the organic layer and the inorganic layer using a CVD method or a sputtering method to form the sealing film that has the layered structure composed of the organic layer and the inorganic layer and that seals the electroluminescent element; and
a laser light irradiation step of irradiating the at least a peripheral portion of the sealing film with the laser light to lower a carbon content of the at least a peripheral portion of the organic layer than a carbon content of the central portion of the organic layer.

9. The method according to claim 8, further comprising:
prior to the laser light irradiation step, a photothermal conversion layer formation step of forming a photothermal conversion layer in at least a portion of the at least the peripheral portion of the sealing film.

10. The method for producing an electroluminescent device according to claim 8, wherein a mask of a same size is used in the sealing film formation step to form the organic layer and the inorganic layer included in the sealing film.

11. An electroluminescent device comprising:
a substrate; and
an electroluminescent element provided on the substrate, wherein
the electroluminescent device comprises a sealing film that seals the electroluminescent element,
the sealing film has a layered structure composed of an organic layer and an inorganic layer,
in the sealing film, at least a peripheral portion of the organic layer has a lower carbon content than a central portion of the organic layer,
at least a peripheral portion of the sealing film is irradiated with laser light to reduce the carbon content of the at least the peripheral portion of the organic layer, and
a photothermal conversion layer is provided at least part of the at least the peripheral portion of the sealing film.

* * * * *